United States Patent [19]

Motley

[11] Patent Number: 5,561,577
[45] Date of Patent: Oct. 1, 1996

[54] ESD PROTECTION FOR IC'S

[75] Inventor: Gordon W. Motley, Ft. Collins, Colo.

[73] Assignee: Hewlett-Packard Company, Palo Alto, Calif.

[21] Appl. No.: 190,756

[22] Filed: Feb. 2, 1994

[51] Int. Cl.$^6$ .................................................. H02H 9/00
[52] U.S. Cl. ........................... 361/56; 361/91; 361/111
[58] Field of Search ............................ 361/56, 91, 111, 361/118

[56] References Cited

U.S. PATENT DOCUMENTS

| | | | |
|---|---|---|---|
| 5,140,401 | 8/1992 | Ker | 357/43 |
| 5,239,440 | 8/1993 | Merrill | 361/91 |
| 5,289,334 | 2/1994 | Ker et al. | 361/56 |

FOREIGN PATENT DOCUMENTS 0388180  3/1490  Japan ................... H01L 23/60

Primary Examiner—Jeffrey A. Gaffin
Assistant Examiner—Stephen W. Jackson
Attorney, Agent, or Firm—Edward L. Miller

[57] ABSTRACT

ESD protection for an integrated circuit having a dirty ground is increased by including an SCR or other protection device from dirty ground to each pad whose driver uses dirty ground. The SCR or other protection device (if triggerable) is triggered by a sensing circuit that is referenced to dirty ground. If there is more than one dirty ground then the one that is used is the dirty ground that is associated with the pad to be protected. Pads not using a dirty ground may also be protected with respect to a dirty ground. A p-type substrate library cell for ESD protection of a pad may be developed that includes a first SCR from the pad to ground, a trigger circuit referenced to ground for the first SCR, a second SCR from the pad to a dirty ground, and a trigger circuit referenced that dirty ground for the second SCR. The trigger circuit for the library cell uses the presence or absence of $V_{DD}$ to provide high or low threshold voltages for triggering the SCR. For n-type substrates where $V_{DD}$ and $DV_{DD}$ take the place of GND and DGND, respectively, on-chip $V_{DD}$ cannot be allowed to select the threshold. An instance of a separate and isolated $V_{DD}$ brought into the IC on its own pin, and not otherwise used internally, can be used as the switching signal.

12 Claims, 13 Drawing Sheets

ESD PROTECTION FOR IC'S

REFERENCE TO RELATED APPLICATION

This Application is related to a copending Application Ser. No. 07/898, 997, entitled ELECTROSTATIC DISCHARGE PROTECTION CIRCUIT FOR INTEGRATED CIRCUITS, filed on 15 Jun. 1992 by Larry Metz, Gordon Motley and George Rieck, and assigned, as is the instant Application, to Hewlett-Packard Co. Application Ser. No. 07/898, 997 is hereby incorporated by reference.

BACKGROUND AND SUMMARY OF THE INVENTION

Electrostatic Discharge (ESD) is a potent killer of integrated circuits (IC's), and especially of IC's using Metal Oxide Semiconductors (MOS). There are various known strategies for protecting MOS IC's from ESD, among which is the one shown in FIG. 1. In FIG. 1 the bonded-out pads of an IC chip are denoted by large black squares, next to which appear associated generalized signal names for the corresponding pins on the IC package, such as $SIG_1$, $SIG_2$, GND and $V_{DD}$. The figure shows output driver transistors that are connected between an output pad and ground (GND); for the sake of brevity, no loads or pull-up transistors are shown connected between these output pads and the power supply $V_{DD}$, although it will be understood that such elements are present. Also, no input pads and associated circuitry are shown, as it will be likewise understood that these structures are also present on most IC's. Inputs are generally inherently more easily protectable than outputs, since it is usually possible to isolate the associated transistor from the input pad by some resistance. Nevertheless, let it be appreciated that inputs also are further protectable by the teachings set out below. It may be the case that typically the incremental benefit of further protecting an input is somewhat less than for further protecting an output, with its necessarily exposed driver transistor. So, we illustrate with outputs, with the understanding that our teachings are applicable to inputs, as well.

According to the strategy of FIG. 1, every pad of the IC chip except GND and $V_{DD}$ is provided with an ESD current path through, and with overvoltage protection with respect to, a common location. (That common location is GND, which is why it is one of the exceptions). The idea is that for an ESD event between any two pins on the IC package (GND and $V_{DD}$ excluded), the (electron or hole) current caused by an ESD event will travel from one of the pins toward GND, and away from GND toward the other pin.

FIG. 1 is associated with an IC that has a core (substrate) 1 of p material, and MOS Field Effect Transistors (FET's) whose sources and drains are of n material. This arrangement produces normally back biased parasitic diodes 2 and 3. There is a parasitic diode 2 associated with each output FET, such as FET 4 for $SIG_2$ and FET 5 for $SIG_1$; these are represented by diodes 6 and 7, respectively. Notice also the protective SCR's 8 and 9, which are in parallel with output FET's 4 and 5, respectively. The particular diode 3 shown in FIG. 1 normally never carries any current (it is shunted by the substrate 1 and its connection to GND), and is henceforth ignored. However, consider a FET whose drain is connected to $V_{DD}$ (say, to serve as a pull-up device for another FET whose source is at GND). It would have a parasitic diode from its source to the substrate 1 (just as diode 3, but without having a cathode permanently connected to GND), and that diode can be of interest. The collection of those particular parasitic diodes that are from $V_{DD}$ to the substrate 1 are represented by diode 10.

Before proceeding, it is well for us to set out specifically what is meant by the term GND (ground). The term GND is used herein to denote the electrically common point within the IC to which power supply return currents are routed and thence combined into one current that is returned to the power supply. There is usually a quite extensive collection of metal traces on the IC that connect various circuit elements to GND. We shall consider these traces to be GND as well, provided, of course, that there is no appreciable or significant voltage drop across them. Of course, GND is not the actual return side of the power supply itself. The IC is probably mounted on a printed circuit board, and the return currents for all of the appropriate circuits on the board are brought together. The return current for that board is then combined in a wiring harness or on a mother board with the return currents from other circuit boards; that point of combination may be called System GND (SGND). The actual point of return to the power supply is probably some significant physical distance away, and it and SGND may not be electrically equivalent to GND for any particular IC, owing to DC voltage drops and noise developed across the AC impedance of the return path. In the same spirit, we shall consider the substrate 1 an element or component that is connected to GND (and probably in lots of places, too), but that nevertheless is not itself GND. The reason is that while it may be a doped semiconductor whose extensive cross section makes it a relatively good conductor as semiconductors go, it is not a particularly good conductor in an absolute sense, say as is copper or aluminum.

Now consider an ESD event, such as the particular one depicted in FIG. 1. For this event the IC could be considered as lying unprotected on a table top, although that is not absolutely necessary. In the particular ESD event shown a source of negative charge 11 arcs to or is otherwise brought into contact with (zaps) the IC pin bonded to pad 12 for $SIG_1$. A resulting (electron) current $I_{IN}$ travels inward toward GND and starts by going through the parasitic diode 7 associated with the transistor 5 that drives, or is connected to, the "start-from" pad 12. The anode of parasitic diode 7 is connected to GND. Once at GND $I_{IN}$ becomes $I_{OUT}$ and the remainder of the path to the "going-to" pad 13 (and thence to destination 15) is through a protection SCR 14 associated therewith, and that is provided for just this purpose. The SCR 14 must be triggered by a voltage sensing circuit (not shown), of which there is one for each such protective SCR (e.g., 8, 9).

The "spoke-hub-spoke" model described above can be examined for contact with positive charge on any single pin, as well as for negative charge on any single pin. In each case the path of the ESD current (of either holes or electrons, as appropriate) through a spoke will be either through a forward biased parasitic diode or through a triggered overvoltage protection SCR. There are, of course, a large number of possibilities with regard to how the ESD current can divide among the spokes. The current could go in toward the hub on a single spoke and out from the hub on several spokes. Likewise, it could go in on several spokes and out on just one, or it could go in on several and out on several. Also, the case of simple charge sharing must be remembered. This happens where a well insulated IC is zapped, and there occurs only an $I_{IN}$ or only an $I_{OUT}$. Finally, it will be appreciated that in the case where the bulk substrate is of n material, all of the parasitic diodes and the protection SCR's are simply reversed, and a comparable spoke-hub-spoke structure obtains.

Before leaving FIG. 1 the reason can be mentioned why $V_{DD}$ is generally not included in the protection scheme outlined thus far. On the one hand, parasitic diodes 10 will take care of static zaps of one polarity, while breakdown of those diodes is relied upon for zaps of the other polarity. Relying upon such breakdown is not foolproof, but in comparison, there is a difficulty in incorporating a triggered switch such as an SCR into overvoltage protection for $V_{DD}$: once an SCR is triggered on the gate loses control and the SCR cannot be simply "turned off". The result could be very bad news indeed for an IC zapped on $V_{DD}$ while the power was on.

A new consideration arises when it becomes desirable to provide separate power supply return paths for various circuits within the IC, as is shown in FIG. 2. The need to do this might arise out of noise immunity considerations, for example. Circuits that involve especially fast edges or particularly large currents are provided with separate return paths ("grounds") to the power supply. Such a separate ground is frequently referred to as a "dirty ground", since it may show significant system induced noise voltages when measured with respect to another location that is closer to or that actually is the return side of the power supply. We shall adopt the usual custom of denoting dirty ground as DGND. Although FIG. 2 depicts an IC having a single DGND, an IC might have more than one dirty ground. Let these be subscripted, thus: $DGND_1$, $DGND_2$, . . . . A remaining return path could be simply ground (GND), or it might make more sense to dispense with the label "GND" and treat any remaining return path as yet another instance of a $DGND_i$. Still another scheme would be to refer to various $GND_i$, some or all of which might be "dirty" and some not.

The labeling scheme chosen doesn't matter too much as long as it is not misleading. That is because when all is said and done, the various DGND's are simply separate return paths for selected circuits that terminate at their own pins, different from the pin for GND, and don't differ from GND in any significant internal detail, save one. That difference is that the meandering conductor that interconnects each of the circuit elements to be connected to GND is deposited directly onto the substrate, while conductors for dirty grounds are insulated from the substrate by an intervening glass layer (e.g., $SiO_2$). From the pins of the IC the various grounds are routed by low-valued ohmic connections to a common location on the return side of the power supply. Naturally, the impedance of the DGND-GND connection is of interest in such an arrangement, so nothing is done that would make that impedance any larger than necessary. It is well to remember, however, that the most probable ESD situation of concern is not when the IC is installed on a PC board that is plugged into a mother board (connecting DGND to GND), but rather is when the IC is a solitary unprotected part, say on a table top. That situation is depicted in FIG. 3; but before turning to that, it will be useful to identify some additional features of interest in FIG. 2.

In FIG. 2 IC output signal pads 24 and 25 are driven by transistors 17 and 20, respectively. The power supply return for driver transistors 17 and 20 is provided by a pad 16 that is DGND. Note that it is known to include a protective SCR 23 with anode connected to DGND and cathode connected to GND. Diodes 18 and 21 are each an instance of parasitic diode 26. Resistances 19 and 22 represent resistances from the anodes of those parasitic diodes, through the bulk of the substrate, to the GND pad 27. In general, resistances 19 and 22 are not equal, and as distributed entities, may partially overlap so that a voltage developed across one is in part communicated to the other. Note also that DGND is not a hub in the sense that GND is; rather, DGND is at a distal end of a spoke whose other end is GND.

The conventional strategy of protective SCR's in spokes whose hub is GND, as described above, doesn't work as well as it ought to when used in IC's having one or more separate dirty grounds (DGND's). Because of resistance in the substrate, and apparently for other reasons that are not always clear, for those MOS IC's having p material substrates there is a definite additional risk of ESD damage to output driver structures that have an associated dirty ground and that are on the positive side of an ESD event. This leads to the hypothesis that the associated SCR is not getting turned on in time, or that if it is, it doesn't do any good. (Presumably, IC's with n material substrates and a dirty ground have a corresponding additional risk with negative zaps to output structures.)

Consider the situation shown in FIG. 3. As shown therein, a source of positive charge 29 zaps pad 24 whose driver transistor 17 operates with respect to DGND 16. The static zap of interest dissipates itself to DGND, as indicated schematically by the ground symbol 28. In this instance it is convenient to consider the currents $I_{IN}$ and $I_{OUT}$ as hole flow, rather than as an electron current. Thus, we show $I_{IN}$ proceeding from pad 24 to GND, and thence as $I_{OUT}$ from GND, through resistance 19 and parasitic diode 18 to DGND 16, and, on to the dissipative location 28. There will be a voltage drop across diode 18 and resistance 19, owing to the passage of $I_{OUT}$. An additional source of voltage drop is to be found in the length of conductor 30 that ties the source of transistor 17 to the pad 16 for DGND. That length of conductor 30 has a resistance, in addition to a small residual inductance which can probably be ignored.

The significance of these various voltage drops mentioned in the preceding paragraph is that: (1) The voltage drop across the length of conductor 30 can elevate the source of transistor 17 above the potential of it surrounding elements, especially those coupled to the gate; and (2) Protective SCR 9, even when triggered, allows the voltage across transistor 17 to be as large as the sum of the voltage drops across diode 18, resistance 19 and the SCR 9 itself. Furthermore, note that if the trigger circuit of SCR 9 is referenced to GND 27, then the voltage drops across diode 18 and resistance 19 do not contribute to getting SCR 9 triggered. This manifests itself as a delay in getting SCR 9 triggered, which may increase the vulnerability of transistor 17. But even if SCR 9 is triggered without delay, with transient currents ($I_{IN}$ and $I_{OUT}$) as high as several amperes, and with damage levels for voltage being fifteen or twenty volts, it doesn't take a very large impedance to produce damaging transient voltage drops across elements 18, 19 and 30 (and especially 19).

The situation is similar, although perhaps not quite as severe, if the source of charge 29 were negative instead of positive. In that case an electron current $I_{IN}$ would pass through diode 7 instead of SCR 9, and $I_{OUT}$ would be an electron current traveling from GND to DGND through protective SCR 23. The impedance of the length of conductor 30 would be of no interest. It would appear that protection of transistor 17 would depend principally upon getting SCR 23 triggered in time.

A solution to this problem is to equip each output structure (and input structures, too, if desired) with an additional protective SCR triggered with respect to the particular dirty ground servicing or associated that structure. It would also be advantageous if the additional SCR could be physically co-located with the conventional SCR referenced to GND. It will further be appreciated that the additional protective device need not necessarily be an SCR; other protective devices such as field oxide punch through devices, field emission devices, spark gaps, zeners and switched FET's could serve as the protective device. The important thing is that it would be connected between the pad whose transistors are to be protected and the associated dirty ground. Some further advantage may be gained by providing a protective device from other pads to DGND, even though the associated transistors for those pads are not served by DGND.

The techniques described herein can be especially useful in qualifying an integrated circuit under MIL-SPEC 883. That standard requires that each pin of an integrated circuit be electrically stressed with respect to every other pin, using the Human Body Model (a source of charge comprising 100 pfd in series with 1.5 Kohm) charged to either two kilovolts, four kilovolts, or greater than four kilovolts, according to a class of compliance desired. Since DGND is one of those pins in a chip that uses a dirty ground, protecting all the other pins just with respect to GND alone does not necessarily provide adequate protection for electrical stress of those pins with respect to DGND.

The preferred protective device is an SCR, which, of course, is something that must be triggered. That implies the use of trigger circuit, whose job it is to respond to an overvoltage between selected locations by triggering an SCR connected across those locations. A trigger circuit has a threshold, and ordinarily the threshold is set somewhat higher than $V_{DD}$ so that transients during power supply turn-on or noise during operation do not trip the trigger circuit. A greater degree of ESD protection for an uninstalled integrated circuit could be obtained if the trigger threshold were set as low as feasible, but to permanently set the threshold there would almost guarantee that the application of power would fire the SCR, rendering the IC unusable. The solution is a trigger circuit that has a threshold that varies as a function of $V_{DD}$, say, $V_{DD}$ plus some approximately constant offset. In this way the trigger circuit is immune to $V_{DD}$, and can use $V_{DD}$ as a signal to determine what the threshold should be.

Using $V_{DD}$ as a signal to select the threshold is effective, but is most easily done when neither of the two selected locations whose voltage difference is applied to the trigger circuit is itself $V_{DD}$. That happy state of affairs obtains when the IC's substrate is of p-type material, since the combinations of IC pins of interest becomes pin to GND and pin to DGND. But for n-type substrates the combinations use $V_{DD}$ in place of GND (or $DV_{DD}$ in place of DGND). Since $V_{DD}$ is now assumed to be in the path of the ESD event, $V_{DD}$ is no longer a reliable source from which to determine trigger circuit threshold. What to do?

The solution is to recognize that the integrated circuit is really only in need of the lowest threshold when it is altogether uninstalled. That is, when an IC is installed on a printed circuit board its degree of vulnerability goes way down, owing to the dissapative ability of the additional external circuit environment. This means that if the absence of $V_{DD}$ can be used to establish the lower threshold while the presence of $V_{DD}$ sets the higher threshold, then the instance of $V_{DD}$ that is used for this purpose does not have to be taken from the conductors distributing $V_{DD}$ within the IC itself. Instead, it can enter the IC from the external environment by using a pin dedicated to that purpose. That is, that dedicated pin is only $V_{DD}$ when the IC is installed; when the IC is not installed it is not connected to $V_{DD}$ (except for its own ESD protection by diodes, which, it turns out, is not contrary the overall purpose). Thus, by means of an externally supplied separate (isolated) $V_{DD}$ brought in on its own pin of the IC, the trigger circuit can have a $V_{DD}$-determined threshold, even when the substrate in of n-type material and $V_{DD}$ is one end of a potential to be compared to that threshold.

DESCRIPTION OF A PREFERRED EMBODIMENT

Figure 1:
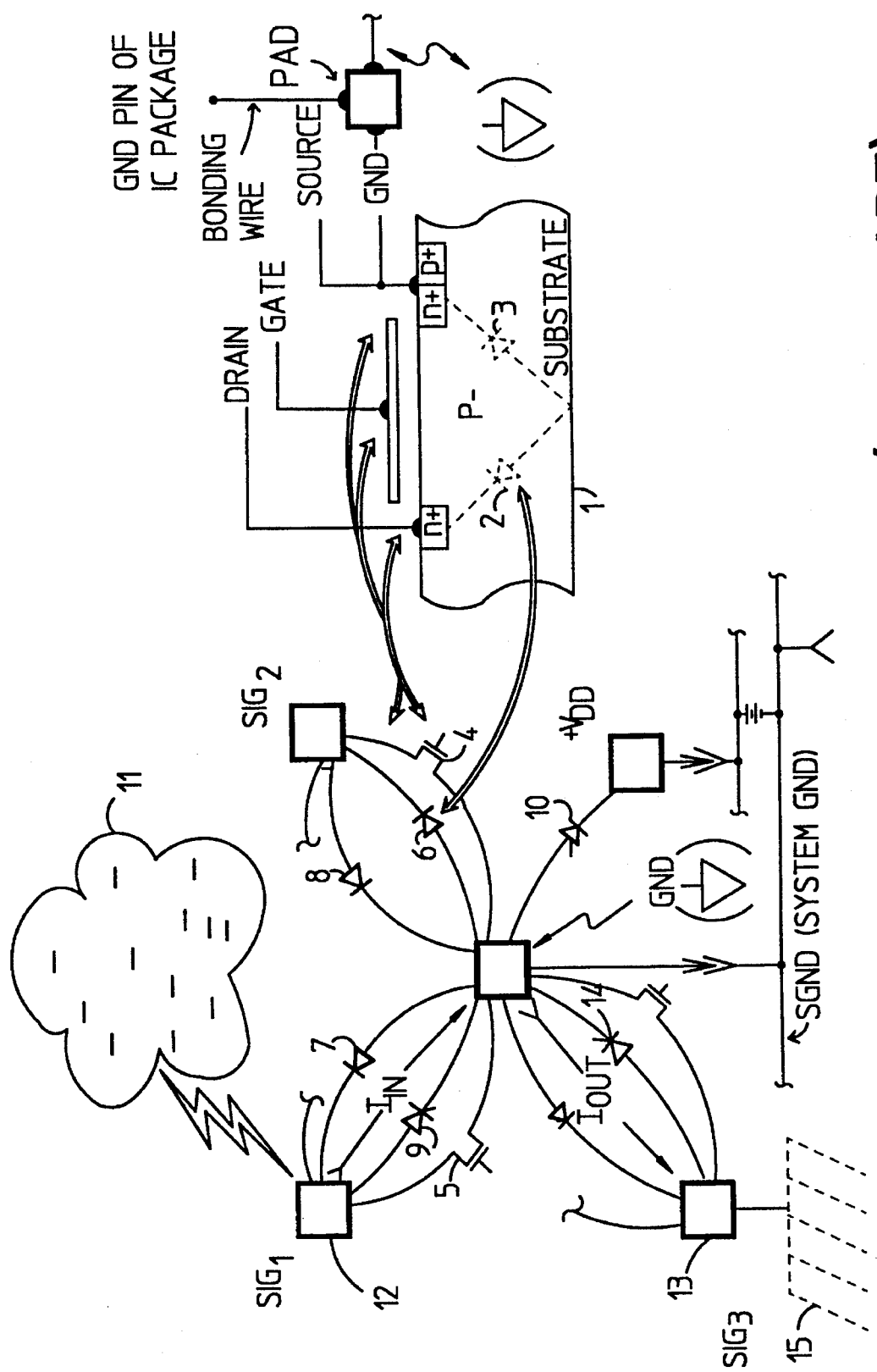
FIG. 1 is an illustration of a conventional technique for the protection of integrated circuits having but a single power supply return (GND) from damage by ESD.
Figure 2:
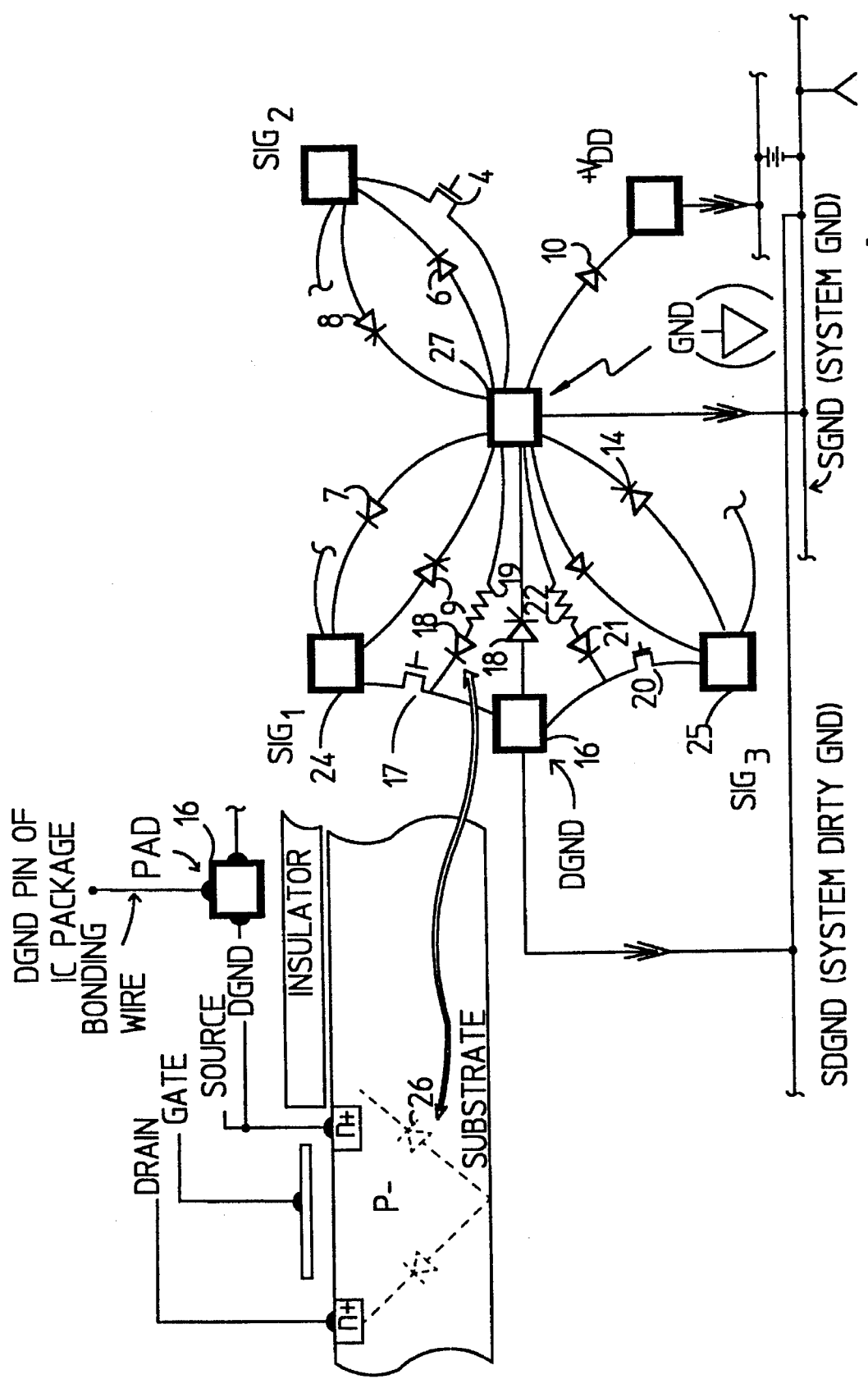
FIG. 2 is an illustration of how the conventional technique of FIG. 1 is used in conjunction with integrated circuits that have one or more separate power supply returns (DGND's)
Figure 3:
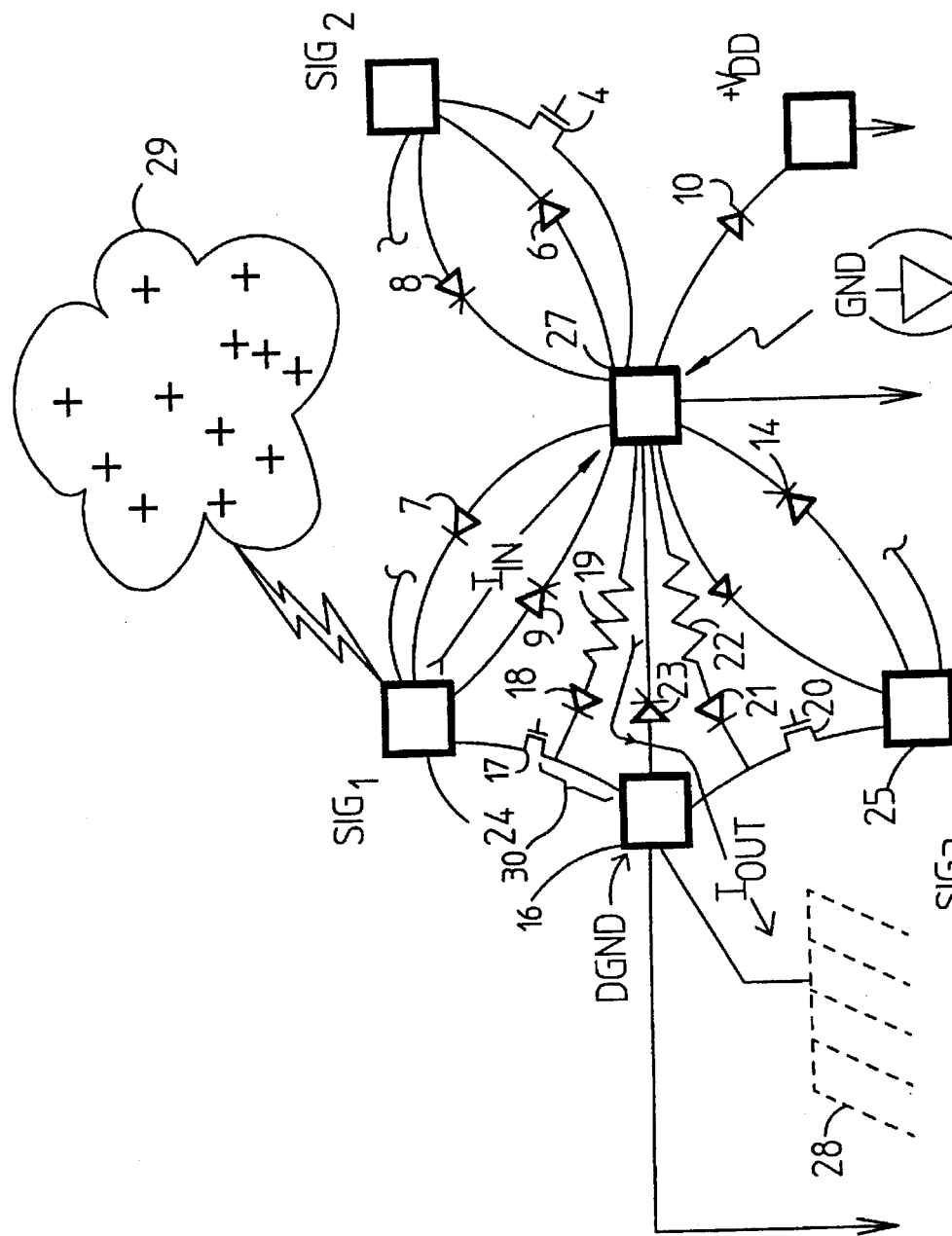
FIG. 3 is an illustration of the operation of the arrangement of FIG. 2 during an ESD event.
Figure 4:
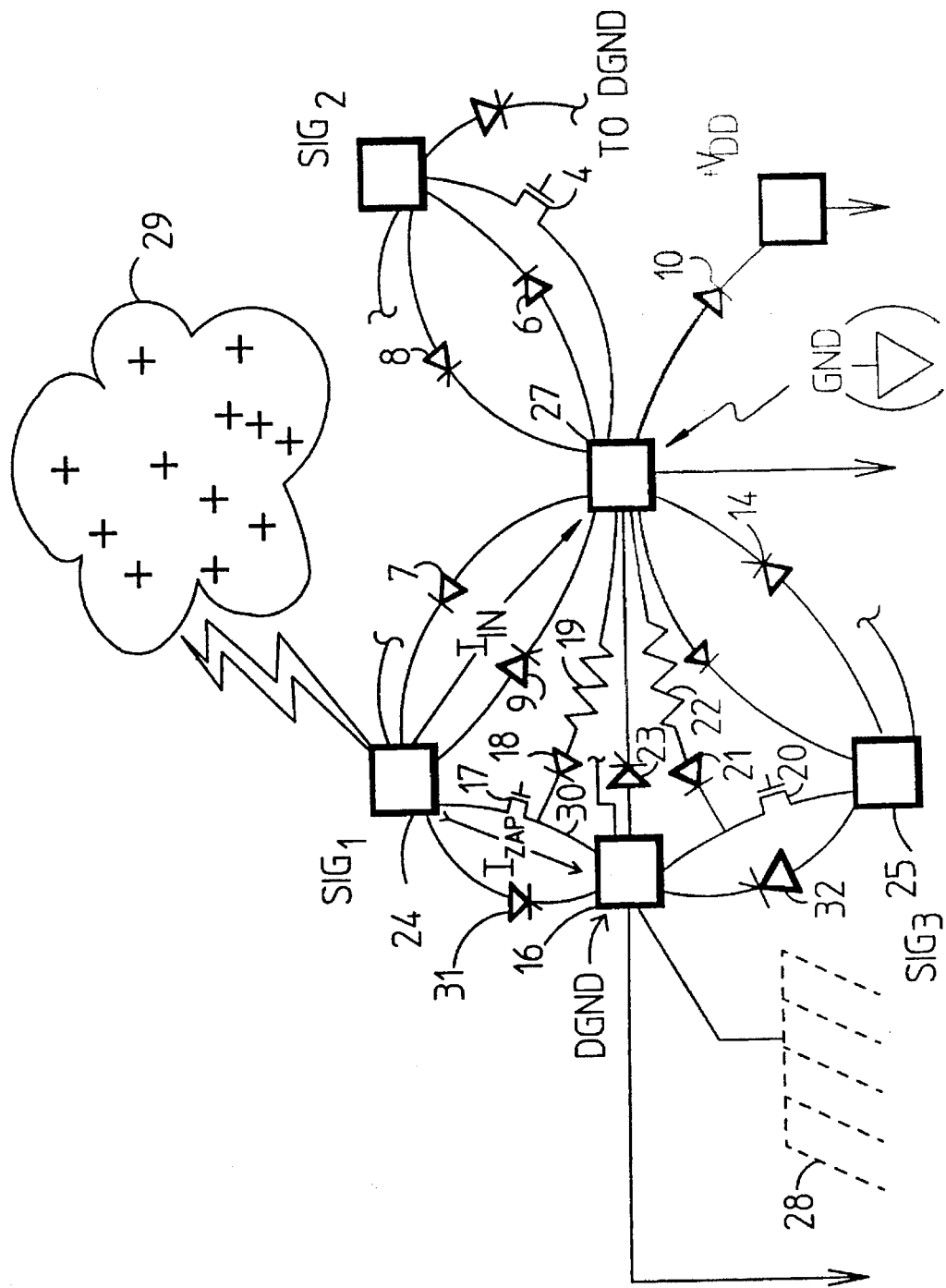
FIG. 4 is a simplified partial schematic diagram of an IC incorporating an improved ESD protection strategy for integrated circuits that have a separate power supply return (DGND)

Refer now to FIG. 4, wherein is shown a simplified partial schematic of an IC having improved ESD protection for output drivers operating with a dirty ground. In the example of FIG. 4 the bulk material of the substrate is p material, so the figure is similar to FIG. 2, and corresponding elements have the same reference characters. FIG. 4 contains additional elements, however, which provide the aforementioned improvement in ESD protection. In particular, note that driver transistor 17 for pad 24, served by DGND 16, is shunted by protective device 31. In like fashion, driver transistor 20 for pad 25, also served by DGND 16, is shunted by protective device 32. Protective devices 31 and 32 are depicted as SCR's, but it will be understood that other types of protective devices may be used, including but not limited to, field oxide punch through devices, field emission devices, spark gaps, switched transistors and zener diodes.

SCR's 31 and 32 are normally off. They are triggered on whenever the voltage across their respective output driver transistors (17 and 20, respectively) rises above a preset level. The trigger circuitry is not depicted in the figure, and is the subject matter a later figure as well as of the incorporated Application of Metz, Motley and Rieck.

During an ESD event that is of the type of principal interest, a source of positive charge zaps a pin bonded to a pad driven by a driver transistor served by DGND. The particular example depicted in the figure has a source of positive charge 29 zapping pad 24, and presumes that the location of charge dissipation is DGND, as indicated by the ground symbol 28. This results in a (hole flow) current $I_{ZAP}$ that travels from pad 24 toward pad 16. It is very undesirable for $I_{ZAP}$ to pass through the associated driver transistor 17, or for transistor 17 to experience elevated voltages relative to surrounding circuit elements. Both of these situations are prevented by triggering protective SCR 31, so that $I_{ZAP}$ flows through SCR 31 (and its all metal path to and from itself) rather than through anybody else. Thus, $I_{ZAP}$ does not flow through length of conductor 30 or diode 18, and especially not through resistance 19, while in addition the related problem of getting SCR 9 turned on is avoided.

Figure 5:
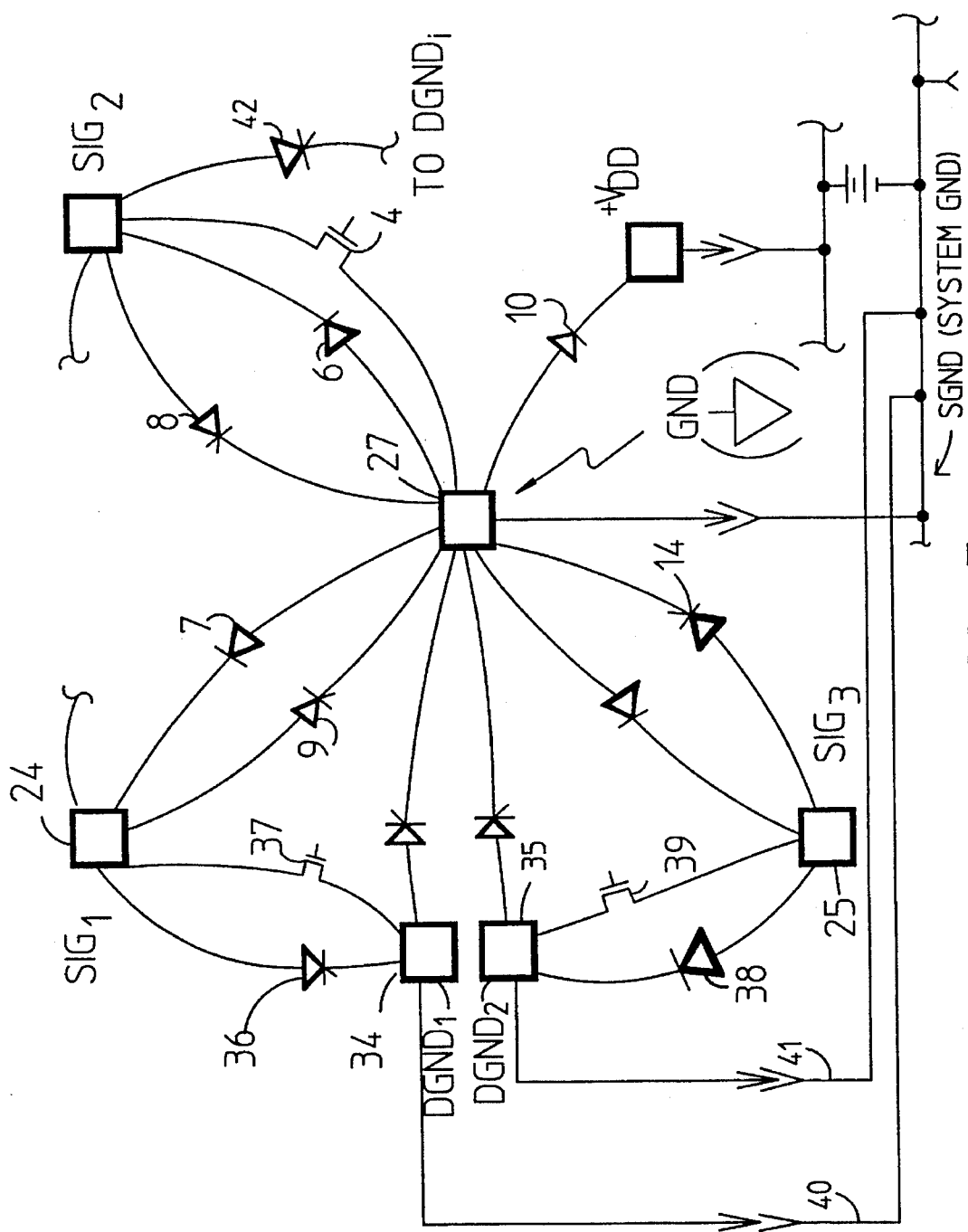
FIG. 5 is a simplified partial schematic diagram of an IC incorporating the improved ESD protection strategy of FIG. 4, but for an integrated circuit that has more than one dirty ground (multiple DGND's)

FIG. 4 depicts a case where the pad 24 for $SIG_1$ and the pad 25 for $SIG_3$ are each driven by transistors both served by the same dirty ground DGND 16. In FIG. 5 the situation is slightly different, in that driver transistors 37 and 39 are each served by a different dirty ground: $DGND_1$ 34 and $DGND_2$ 35, respectively. $DGND_1$ 34 and $DGND_2$ 35 are connected by conductors 40 and 41, respectively, to SGND. To cooperate with this arrangement, protective SCR 36 is coupled between pads 24 and 34, while protective SCR 38 is coupled between pads 25 and 35. In this way protective SCR 36 shunts driver transistor 37 when needed, and protective SCR 38 shunts transistor 39.

Finally, note protective SCR's 33 of FIG. 4 and 42 of FIG. 5; each is coupled to and triggered with respect to, an associated dirty ground. These SCR's offer optional additional protection for driver transistors whose return current paths are through GND rather than any of the dirty grounds.

Figure 6:
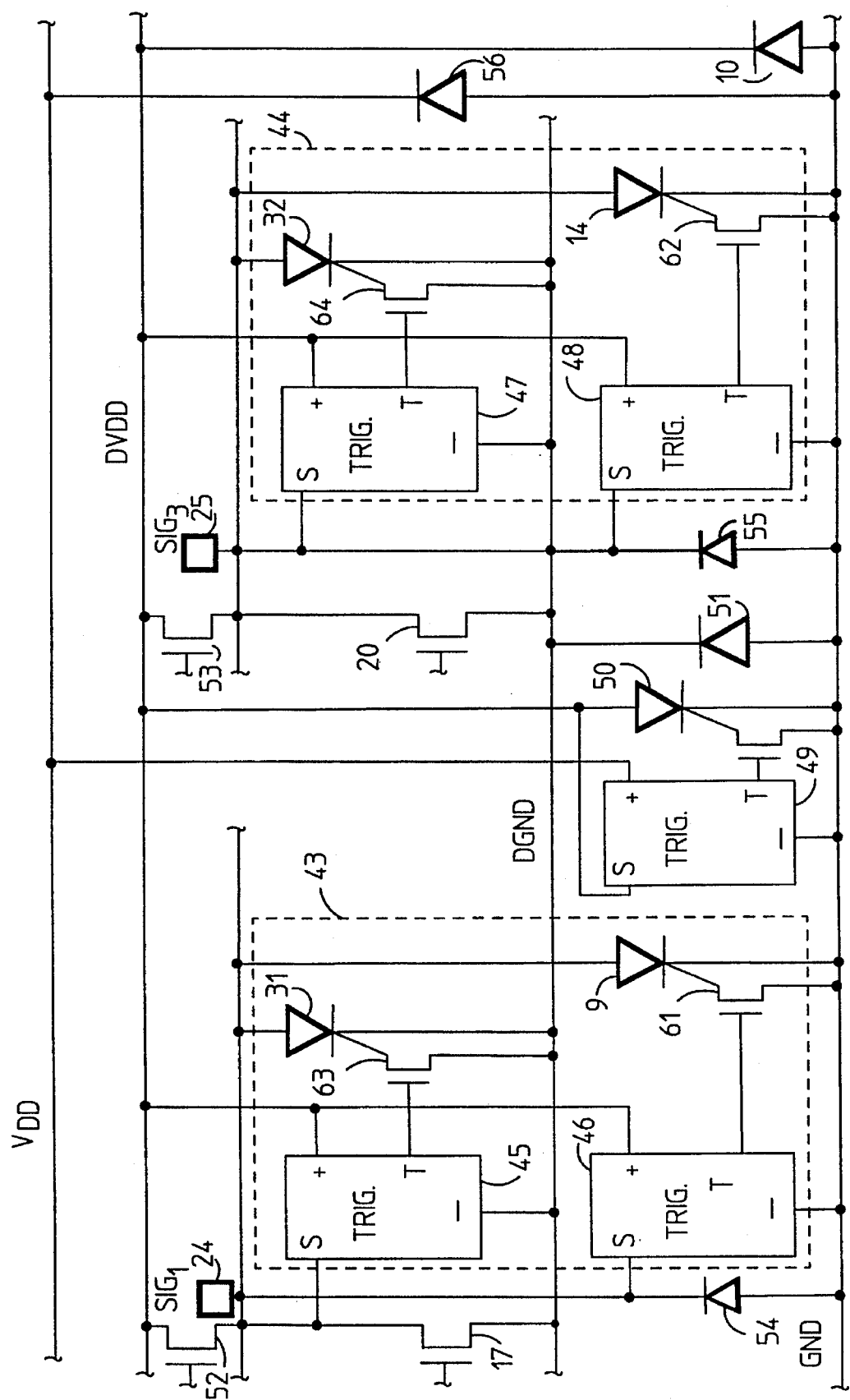
FIG. 6 is a more detailed schematic of a particular instance of the improved ESD protection strategy of FIG. 4.

Refer now to FIG. 6, wherein is shown a more detailed schematic arrangement of improved ESD protection for an IC. As shown in the figure, pad 24 for $SIG_1$ is pulled down to DGND by transistor 17 and up to $DV_{DD}$ by a transistor 52. ($DV_{DD}$ is Dirty $V_{DD}$—a supply separate from and presumably not as clean and quiet as regular $V_{DD}$.) In similar fashion pad 25 for $SIG_3$ is pulled to DGND and $DV_{DD}$ by transistors 20 and 53, respectively. Diode 54 represents the parasitic diode at the drain of transistor 17, as well as the one at the source of transistor 52. Diode 55 represents similar parasitic diodes for transistors 20 and 53. Diodes 10, 51 and 56 each represent various instances of other classes of parasitic diodes formed by the fabrication of the transistors of the IC.

Pad 24 is protected from positive ESD zaps by the SCR's and associated trigger circuitry belonging to a protection cell 43, whose extent is indicated by the dotted line. Pad 25 is likewise protected by protection cell 44, which is identical in nature to cell 43. Each protection cell (43, 44) includes two SCR's: one from the pad to each of GND and DGND. Each SCR (31, 9 & 32, 14) has an associated gate driver transistor (63, 61 & 64, 62, respectively) and an associated trigger circuit (45, 46 & 47, 48, respectively), all referenced to either GND or DGND, so as to be the same as the SCR.

Each trigger circuit has four nodes. These are: Signal "S", which is connected to the pad to be protected; Plus Power "+", which is connected to $V_{DD}$ or $DV_{DD}$, as appropriate; Minus Power "−", which is connected to GND or DGND, as appropriate for the SCR to be triggered; and, Trigger "T", which is connected to the gate driver transistor of the SCR to be triggered. In a preferred embodiment a protection cell contains a pair of trigger circuits and a pair of SCR's (along with their respective gate driver transistors), with one member of each pair being coupled or referenced to GND and the members of the other pair being referenced to a dirty ground.

However, note that the same trigger circuit 49 can be used in isolation to trigger a solitary SCR 50. In the case shown, $V_{DD}$ is the signal being protected as well as being the source of power, so nodes "S" and "+" are both connected to $V_{DD}$. It will, of course, be understood that $V_{DD}$ could be protected to both GND and DGND at the same time by the use of a protection cell, such as 43 or 44. In such a case the "S" and "+" nodes of each of the two trigger circuits would be connected to $V_{DD}$. Likewise, DGND can be protected with respect to GND through the use of a protection cell such as 43 or 44.

The instances (45–49) of the preferred trigger circuit shown in FIG. 6, and explained below, are merely exemplary. It will be understood that other trigger circuits might be suitable. The particular trigger circuit shown is one of several suitable circuits disclosed in the incorporated application of Metz, Motley and Rieck, and is intended to trigger an SCR (by turning on its associated gate driver transistor) whenever there is (with respect to the "−" node) a large positive voltage on the "S" node. This trigger circuit is ESD-powered, in that the energy of the ESD event itself supplies the power necessary to trigger the SCR, even when the IC is un-installed and there is no $V_{DD}$. This trigger circuit is also one whose threshold is a function of $V_{DD}$: low when it is absent and high when it is present. In particular, the low threshold is in the range of one to two volts, while the high threshold is in the range of eight to nine volts.

Figure 7:
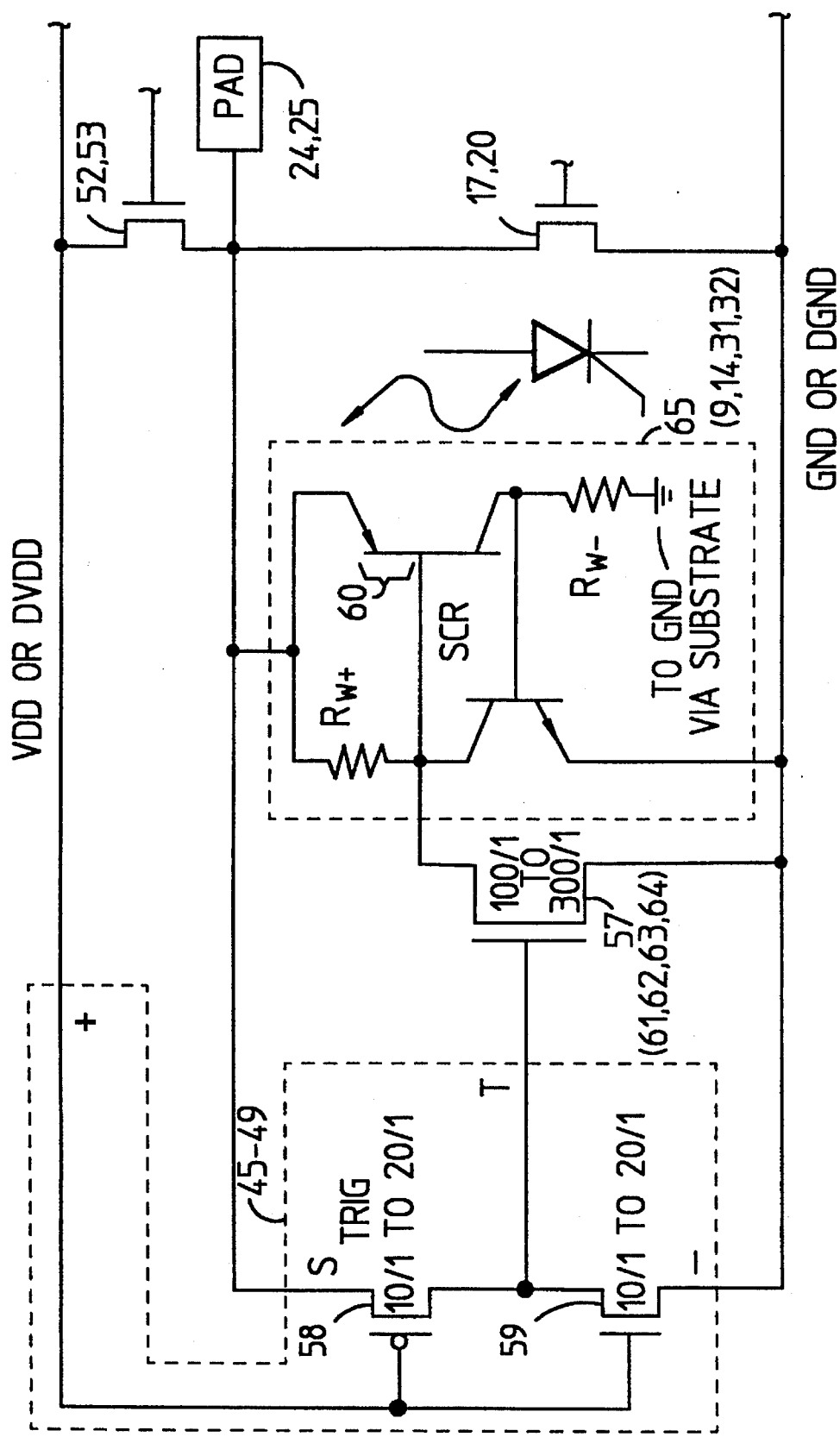
FIG. 7 is a more detailed schematic of a trigger circuit portion of FIG. 6.

The schematic of the preferred trigger circuit 45–49 is shown in FIG. 7, and is accompanied therein by a schematic representation of an SCR 65 (any of 9, 14, 31 or 32) and of an (output) driver (52, 53) for a pad (24, 25). There follows now an abbreviated explanation of the operation of the combination of the trigger circuit (45–49), SCR 65 (9, 14 31, 32) and pad driver (17,20). A more extensive explanation may be found in the incorporated patent application of Metz, Motley and Rieck.

First, suppose that the IC is un-installed, and that pad 24, 25 is zapped positive with respect to whichever of ground or dirty ground the particular trigger circuit 45–49 is referenced to. Since the IC is un-installed, $V_{DD}$ is absent; thus as a positive voltage begins to rise on the pad (24, 25) transistor 58 conducts while transistor 59 does not. This allows transistor 57 (any of 61–64) to conduct the gate current needed to turn on the SCR 65 (9, 14, 31, 32). The source of the gate current is the positive zap itself. Once gate current begins to flow the SCR 65 turns on to provide the protective low impedance shunt that prevents excessive voltage and provides a safe path for the large current ($I_{ZAP}$) of the ESD event.

Now suppose that the IC is installed and in operation when the positive zap to the pad (24, 25) occurs. Transistor 58 is off and transistor 59 is on, resulting in transistor 57 being off. The developing overvoltage from the zap to the pad (24, 25) is communicated to transistor 57 via well resistance $R_{w+}$ and the PN junction 60 within the SCR itself. The overvoltage at the pad also causes transistor 58 to turn on (its gate stays at $V_{DD}$ for the conditions assumed here), which in turn turns on transistor 57. (Both transistors 58 and 59 are now on, forming a voltage divider that raises the gate voltage to transistor 57. But the transistors are robust enough and the zap is exhausted sufficiently soon by the SCR 65, so that transistors 58 and 59 are not damaged.) Transistor 57 then carries current (through well resistance $R_{w+}$ and the PN junction 60), which in turn triggers the SCR 65. There is a relationship between the size of the FET 57 and the well resistance $R_{w+}$ (discussed in Metz, et.al) which keeps FET 57 from being damaged before the SCR 65 gets turned on. The fractions next to the FET's in the trigger circuit 45–49 indicate a useful range of device sizes. The SCR is, of course, huge in comparison to the FET's, since it is necessary for it to carry a relatively large current, say on the order of one to one and a half amperes.

Figure 8A:
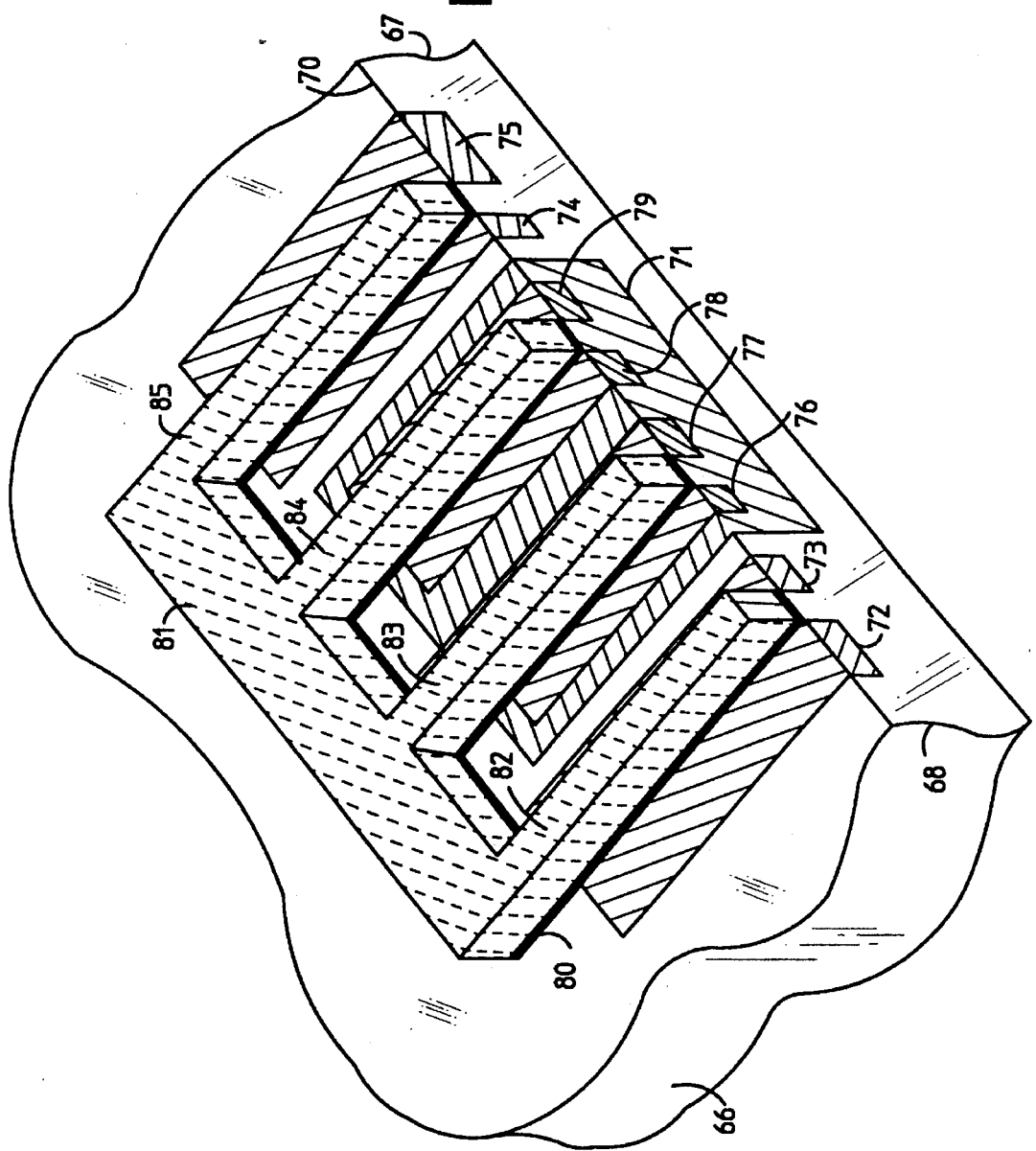
FIGS. 8A and 8B are a cut-away pictorial representation of a portion of a library cell having two ESD protection SCR's and respective trigger circuits referenced to different power supply returns.
Figure 8B:
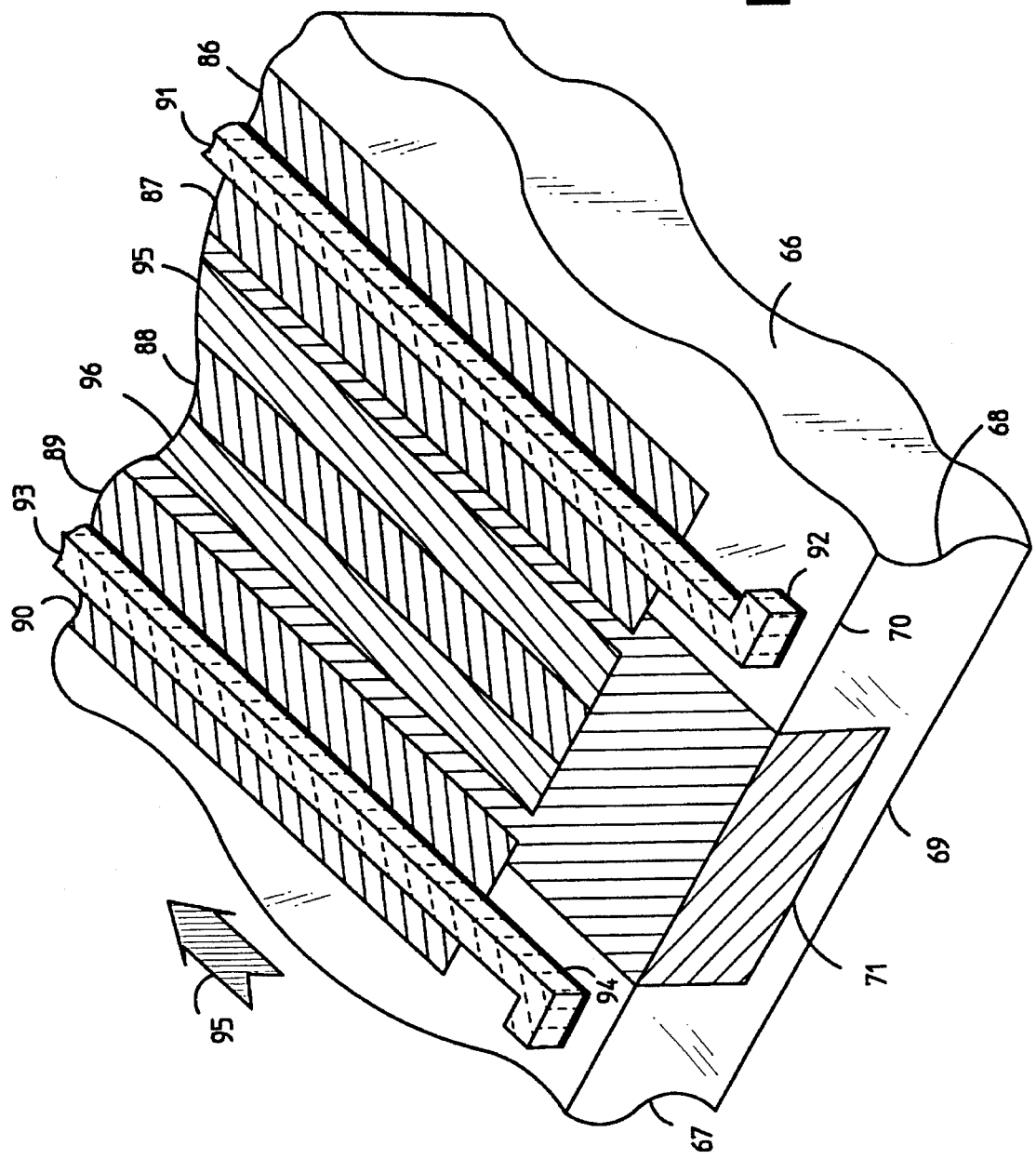
Figure 9:
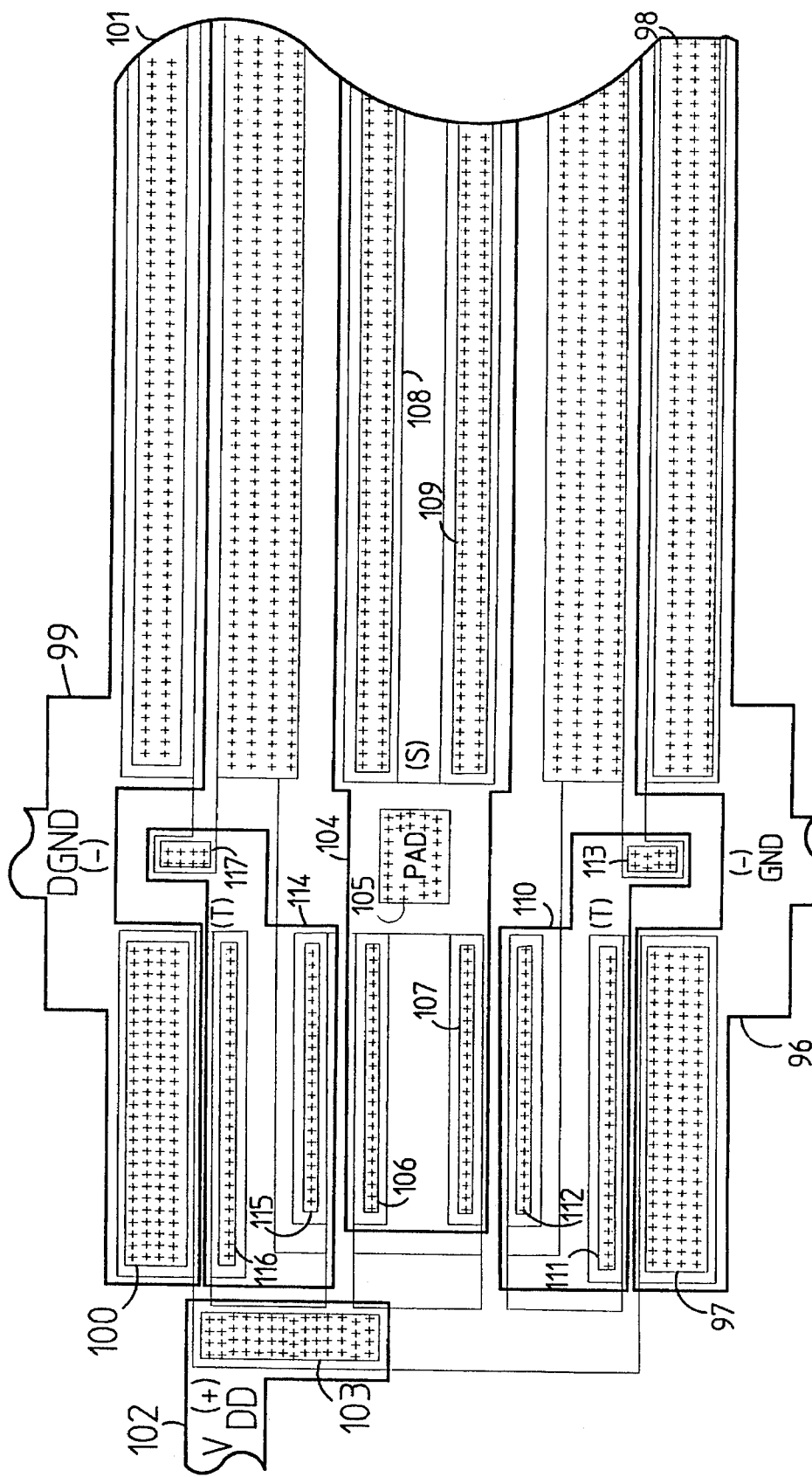
FIG. 9 is a pictorial representation of a layer of deposited metal used to interconnect various circuit elements in FIGS. 8A and 8B, and depicts a remaining portion of the library cell of FIGS. 8A and 8B.

Refer now to FIGS. 8A and 8B, wherein are depicted fanciful sectional views of a trigger/SCR portion of an integrated circuit; the portion shown may be a library cell used a plurality of times in an integrated circuit. FIG. 8A depicts the trigger portion corresponding to trigger circuits 45 and 46 (or 47 & 48) of FIG. 6, while FIG. 8B depicts SCR's and gate driver transistors corresponding to SCR's 31 and 9 and associated gate driver transistors 63 and 61 (or 32, 14 & 64, 62). For clarity and ease of illustration any adjacent circuitry has been suppressed, and the substrate 66 shown as if sawn along lines 69 and 70 with the resulting two pieces opened away from each other as though edge 67 were a hinge. (Of course, edge 67 is not actually a physical edge at all, but merely that location on the substrate where the depiction thereof in the figure stops.) What is shown in FIGS. 8A and 8B are the various dopants and structural elements resulting from the fabrication of MOS transistors and SCR's. The depictions are not complete as to all layers of material deposited onto the substrate; FIG. 9 depicts an interconnecting layer of metalization deposited upon an intervening layer of glass. Finally, these figures are not to scale, particularly with regard to the depth of the substrate 66, which is of silicon doped to be p–. In other respects, however, they are descriptive in a way that is quite useful.

Here then, is what is depicted in FIG. 8A. To begin with, shaded region 71 is an n-well that is common to both FIGS. 8A and 8B. Shaded regions 72–75 are doped to be n+, while shaded regions 76–79 are doped to be p+. The heavy dark line 80 represents a layer of gate oxide about three hundred angstroms thick. The dotted region 81 above the layer of gate oxide 80 is polysilicon; it is a medium resistance material used to form conductive gate surfaces for MOS transistors. Those skilled in the art of MOS IC's will recognize that FIG. 8A depicts four MOS transistors whose gates are formed by regions of polysilicon 82, 83, 84 and 85.

In particular, it will be appreciated in view of the remaining disclosure below, that regions 72, 82 and 73 form MOS transistor 59 (see FIG. 7) of trigger circuit 45 (in FIG. 6). Likewise, regions 76, 83 and 77 form MOS transistor 58 (referencing the same figures). Similarly, regions 75, 85 and 74 form MOS transistor 59 (a different instance!) of trigger circuit 46, while regions 79, 84 and 78 form the associated MOS transistor 58, also of trigger circuit 46.

FIG. 8B depicts the associated SCR's and their gate driver transistors. As to the shading in FIGS. 8A and 8B, like styles of shading denote the same dopant or other deposited material. (For the purpose of determining if styles of shading are alike, the physical orientation of FIGS. 8A and 8B relative to each other should be such that lines 69 of the two figures and lines 70 of the two figures are parallel.) In FIG. 8B shaded region 71 is the common n-well (i.e., it is common to both figures). Regions 86 and 87 are doped to be n+, while line 92 denotes a layer of gate oxide and the dotted region 91 thereabove represents a deposited layer of polysilicon. Taken together, elements 86, 87, 91 and 92 form the instance (in FIG. 7) of FET 57 that is connected to DGND. In like fashion, elements 89, 90, 93 and 94 form the instance of FET 57 that is connected to GND. In each of these instances of transistor 57 its source is connected to the collector of a bi-polar transistor that is interior to the associated SCR 65. That is, regions 87 and 89 are each the source of a FET and the collector of a bi-polar npn structure within the SCR.

Specifically, the instance of SCR 65 that connects the pad (24, 25) to DGND is made up of regions 95, 71, 66 and 86. Similarly, the instance of SCR 65 that connects that same pad to GND is made up of regions 96, 71, 66 and 90. Note that these instances of SCR's 65 are really a great deal longer in the direction of the arrow 95 than is depicted in FIG. 8B. That is, if the width of gates 82–85 in FIG. 8A were ten microns, then the width of the SCR's in FIG. 8B would be on the order of two to four hundred microns.

FIG. 9 depicts a pattern of metalization and its interconnection with the integrated circuit elements shown in FIGS. 8A and 8B. To properly appreciate FIG. 9 it should be understood that it is a top view of the pattern of metalization, and that as a top view it applies to FIGS. 8A and 8B as though their contents were not sawn apart, but were instead joined along lines 67–70. Next, it will be appreciated that integrated circuit structure depicted in FIGS. 8A and 8B are coated with a layer of "glass" (e.g., silicon dioxide), into which holes are etched to allow the metal to make electrical contact with elements of the integrated circuit below the glass. In FIG. 9 it is as though there were but a single layer of glass and a single layer of metal. This is a simplification for the sake of brevity, and it will be appreciated by those skilled in the art that it is usual for there to be several layers of metal separated by intervening layers of glass. In FIG. 9 no attempt has been made to illustrate the layer of glass, since it is everywhere, except where there are holes therein. What is shown is the pattern of the metalization; it is depicted by the heavy lines, such as 96, 99 and 102. The locations of holes in the glass where the metalization contacts the integrated circuit elements below are indicated by the rectangular regions filled with cross hatching. Finally, the light lines denote the broad outlines of the integrated circuit structure shown in FIGS. 8A and 8B. These light lines are included for reference (even when they ought to be obscured by the overlying metal), so that the registration of the metalization to those integrated circuit elements below may be appreciated.

Specifically, FIG. 9 shows a metal trace 96 that is GND and that makes contact with elements of FIGS. 8A and 8B at locations 97 and 98, as indicated by the cross-hatching. Metal trace 96 serves as the "–" node for the trigger circuit (46, 48) referenced to GND. In similar fashion a metal trace 99 that is DGND makes contact at locations 100 and 101, and serves as the "–" node for the trigger circuit (45, 47) referenced to DGND. $V_{DD}$ is supplied by a metal trace 102 that make contact at region 103; it serves as the "+" node for the different trigger circuits (45 & 46 or 47 & 48). Metal trace 104 connects via region 105 to the pad (24, 25) and via regions 106–109 to the two trigger circuits (45 & 46 or 47 & 48) and the two SCR's (31 & 9 or 32 & 14, respectively). Metal trace 104 serves as the "S" node for both trigger circuits (45 & 46 or 47 & 48). Also shown is trace 110, which makes contact at regions 111–113. This trace serves as the "T" node for the ESD protection trigger circuit (46, 48) referenced to GND and that is coupled to the SCR (9, 14 connected between the pad and GND. In like fashion, trace 114 makes contact at regions 115–117 and serves as the "T" node for the ESD protection trigger circuit (45, 47) referenced to DGND and that is coupled to the SCR (31, 32) connected between the pad and DGND.

The location of the protection cells (43, 44) within the integrated circuit is of some interest. In accordance with the usual protocol concerning ESD protection, the interior region of the integrated circuit contains all the particular circuitry that meets the motive for having the integrated circuit in the first place. Around the edges of the that interior circuitry are located the various bonding pads that receive bonding wires connecting to the pins that traverse the outer packaging. Around the very outside of the die runs a perimeter ring. The preferred location for the ESD protection cells (43, 44) disclosed herein is just inside the perimeter ring, between it and the bonding pads.

To this point we have principally been concerned with NMOS FET's fabricated with p-type substrates. We turn now to the case of PMOS FET's fabricated upon n-type substrates. With that process it is the PMOS FET fabricated directly in the substrate that is most susceptible to ESD damage. Those FET's are generally pull-up transistors connected between a pad that is bonded-out and either of $V_{DD}$ or $DV_{DD}$. In keeping, then, with the thrust and spirit of the teachings of the foregoing disclosure, such PMOS FET's can be protected with protection cells that are connected between the associated bonding pad and one of $V_{DD}$ and $DV_{DD}$, as appropriate. The protection cells can incorporate SCR's, and the trigger circuit therefor can be either of an active or of a passive variety. We shall observe the usual convention that $V_{DD}$ is always positive with respect to GND. We shall see that the ESD event of particular interest is when the pad is zapped negative with respect to $V_{DD}$ (or to $DV_{DD}$).

Figure 10:
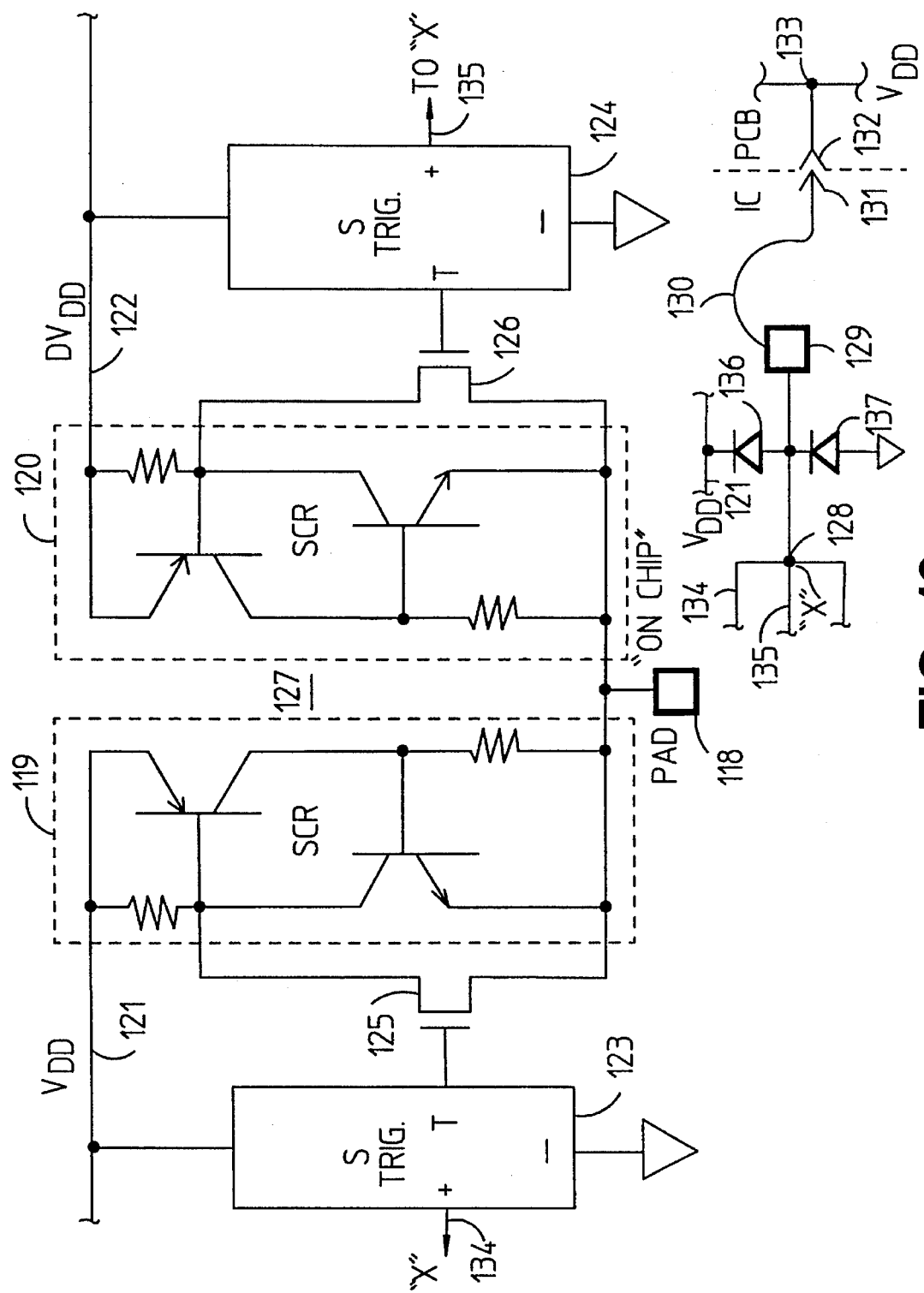
FIG. 10 is a schematic segment of a protection cell generally similar to those of the preceding figures, but adapted for use with PMOS FET's fabricated upon n-type substrates.

Refer now to FIG. 10, wherein is shown a schematic segment of such a protection cell 127. It includes two SCR's 119 and 120, respectively connected between the bonding pad 118 and $V_{DD}$ or $DV_{DD}$. SCR 119 is triggered by turning on FET 125; SCR 120 is likewise triggered by turning on FET 126. Each of these FET's is controlled by the "T" node of a respective trigger circuit 123 and 124. Each of the trigger circuits is connected to an associated power supply ($V_{DD}$ or $DV_{DD}$), as well as to the pad 118 and (probably) to GND (or perhaps DGND). What each of trigger circuits 123 and 124 must do is turn on their associated trigger FET (125 and 126, respectively) when there is an ESD event, but avoid false triggers such as during the legitimate onset of the power supplies. The particular trigger circuits 45–49 disclosed for use with p-type substrates are directly usable as trigger circuits 123 and 124, provided that they are connected as shown in FIG. 10.

In contrast with FIG. 6, where the "S" node was connected to the pad being protected, in FIG. 10 the "S" node is connected to the power supply: i.e., $V_{DD}$ 121 or $DV_{DD}$ 122. Furthermore, the "+" nodes (via conductor 134 for trigger circuit and conductor 135 for trigger circuit 124) are connected to a common point "X" 138 with the integrated circuit. All other "+" nodes from other trigger circuits would also be common to "X" also, unless subject to the circumstance described in a subsequent paragraph below. The common point "X" 128 is connected to a bonding pad 129. A bonding wire 130 connects pad 129 to a pin 131 on the IC's package. Pin 131 mates with contact 132 that is part of a socket on, or is a mounting hole in, a printed circuit board (PCB) or other environment external to the integrated circuit. Contact 132 is electrically coupled to the instance of $V_{DD}$ 133 that is distributed to the various IC's carried by the PCB or that are otherwise in the external environment. The $V_{DD}$ thus brought onto the IC to point "X" via pin 131 should not be confused with the regular "on chip" $V_{DD}$ 121 that is otherwise brought onto the IC, anyway. The purpose of common point "X" is to provide a signal source on the IC that is just like $V_{DD}$ whenever the IC is installed in an external environment, but that has no internal connection to the regular "on chip" $V_{DD}$ when the IC exists in isolation; e.g., is not installed in an external environment, such as a PCB.

Since the common point "X" is bonded out to the outside, it also needs to be protected against ESD. This may be easily done by including diode 136 to "on chip" $V_{DD}$ 121 and diode 137 to GND.

The reason that the "+" node cannot be connected to the "on chip" $V_{DD}$ 121 is as follows: Suppose that there were, for an uninstalled IC, and ESD event between the pad and $V_{DD}$ (or $DV_{DD}$), and that the pad was at the positive end or side of that event. If the "+" node were connected to $V_{DD}$ 121, it would turn the off the PFET 58 in the trigger circuit 45–49 (refer to FIG. 7). That would drastically reduce the effectiveness of the trigger circuit, since it is intended that PFET 58 turn on during such an ESD event.

Aside from this business of the common point "X" for what may be termed "isolated $V_{DD}$ (or $DV_{DD}$), the general overall operation of the trigger circuits 123 and 124 is the same in FIG. 10 as for FIGS. 6 and 7. That is, two major cases obtain: case #1 where $V_{DD}$ is on (also implies that the IC is installed) and hence that isolated $V_{DD}$ is also present; and, case #2 where $V_{DD}$ is off and where the IC is not installed. An analysis of these two major cases will shown that they each operate the same whether for FIG. 6, 7 or 10. That is, for case #1 events transistor 59 is on with transistor 58 normally off, and the ESD event turns them both on, forming a divider and triggering the SCR. The threshold voltage for case #1 events is "high"; i.e., the voltage at the midpoint of the divider plus the turn-on voltage for transistor 57. For case #2 events transistors 58 and 59 are normally both off, and the ESD event turns transistor 58 on and supplies the energy to fire the SCR. The threshold voltage for case #2 events is "low"; i.e., the sum of the turn-on voltages for transistors 58 and 57.

That is not to say that there are no differences between the larger cases of p-type and n-type substrates. To be sure, use of p-type substrates with NMOS FET's formed directly therein allows the "+" node to be connected to $V_{DD}$ (which is advantageous). Use of n-type substrates with PMOS FET's formed directly therein has a disadvantage if the "+" node is connected to $V_{DD}$, but does operate advantageously if the "S" node is connected to an isolated instance of $V_{DD}$. Furthermore, none of this is to say that the isolated $V_{DD}$ technique is limited to use with only n-type substrates; it could just as well be used with p-type substrates. The isolated $V_{DD}$ mechanism has to do with cases where $V_{DD}$ is at one end of an ESD path to be protected: pad to $V_{DD}$. In such cases $V_{DD}$ is not an appropriate auxiliary mode control signal for the trigger circuit, as it can be when the path to be protected is pad to GND or pad to DGND (i.e., $V_{DD}$ is not part of the path).

There is, however, one additional consideration connected with the use of an isolated instance of $V_{DD}$ coupled to the "S" node of the trigger circuit (123, 124). First, there is probably no need to distinguish between $V_{DD}$ and $DV_{DD}$ if the latter is indeed derived from the former. That is, an isolated instance of either would serve as the signal to be provided to the "+" node of any trigger circuit 123 or 124 whose "S" node was connected to either on-chip $V_{DD}$ 121 or on-chip $DV_{DD}$ 122. However, note the following potential for mischief: Protection circuit #1 operates with $V_{DD}$#1 connected to node "S" and isolated $V_{DD}$#1 on node "+". Protection circuit #2 operates with $V_{DD}$#2 connected to its node "S" and isolated $V_{DD}$#1 On its node "+". Now suppose that, for whatever reason (failure of an element in some system, oversight in assembling a system, etc.), $V_{DD}$#2 is present without isolated $V_{DD}$#1. This could easily look like a case #2 ESD event, turning on transistor 58 in protection circuit #2. That would trigger its associated SCR, which is bad news for the IC and for the $V_{DD}$#2 power supply. For example, suppose $V_{DD}$#2 were a long term battery supply, while $V_{DD}$#1 were a line operated supply susceptible to being turned off. The solution is to supply protection circuit #2 with isolated $V_{DD}$#2 instead of with isolated $V_{DD}$#1. Isolated $V_{DD}$#2 would be derived ("by jumper", as it were) in the same way that $V_{DD}$#1 is produced.

As a final summary of the similarities and differences set out above, consider the following Table 1:

TABLE 1

| "+" = $V_{DD}$ | "S" = $V_{DD}$ & "X" = ISO $V_{DD}$ |
|---|---|
| IN BOARD | IN BOARD |
| $V_{DD}$ on: Case #1 | $V_{DD}$ on: Case #1 |
| $V_{DD}$ off: Case #2 (effectively) | $V_{DD}$ off: Case #3 |
| OUT OF BOARD | OUT OF BOARD |
| $V_{DD}$ on: Absurd | $V_{DD}$ on: Absurd |
| $V_{DD}$ off: Case #2 | $V_{DD}$ off: Case #2 |

The following remarks apply to Table 1. The two case #2's for " +"=$V_{DD}$ differ only in minor details, such as capacitances present on the $V_{DD}$ supply trace, etc. Such differences are quite minor, since $V_{DD}$ is not the thing being zapped. There is a Case #3 for " S"=$V_{DD}$. In Case #3 the ESD event (minus pad to positive $V_{DD}$) turns transistor 59 on while (probably) failing to turn transistor 58 on. Momentary breakdown of transistor 57 is then relied upon to get the associated SCR triggered. While this is a circumstance of lesser desirability, it is not as bad as it seems. First, the IC is installed in the PCB. Studies have shown that this alone increases very substantially the survivability of the IC. Next, it turns out that transistors 57, 58 and 59 can indeed survive the experience. And finally, it is worth noting that a similar situation can occur anyway in Case #1 for " +"=$V_{DD}$. Refer again to FIG. 7 and suppose that a pad-positive ESD event occurs while the IC is in operation and while pull-up transistor 52 or 53 is on. Now the ESD event is communicated to the gates of transistors 58 and 59, with the possibility of that turning transistor 58 off and transistor 59 on—exactly the opposite of what is desired. In such a case momentary breakdown of transistor 57 is what saves the day.

Figure 11:
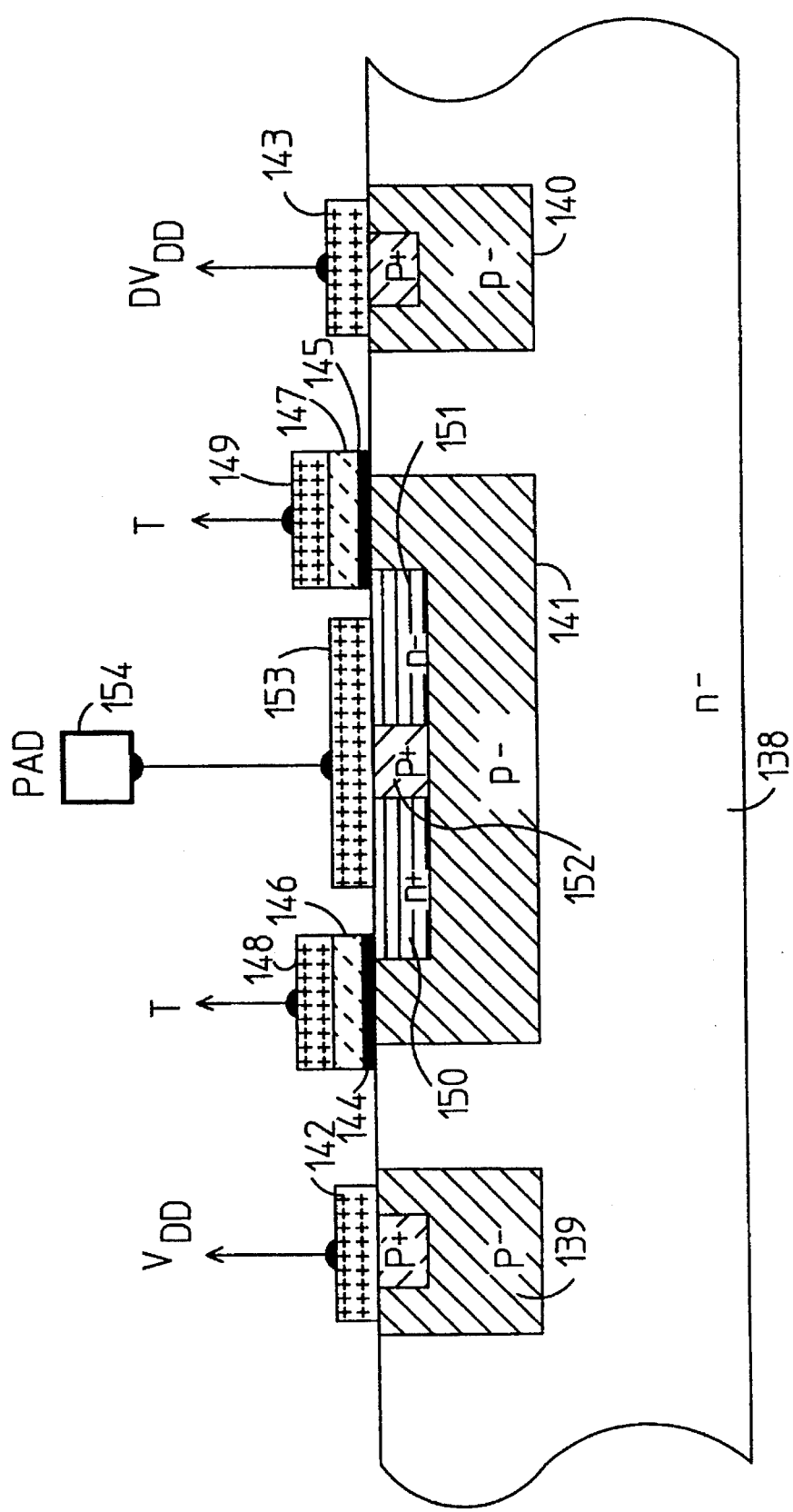
FIG. 11 is a simplified and stylized cut-away side view of the SCR portion of the protection circuit in FIG. 10 for PMOS transistors fabricated upon an n-type substrate.

To complete our discussion of the case where the substrate is of n-type material, refer now to FIG. 11, wherein is shown a simplified cross sectional view of the SCR portion of a protection cell to be used in n-type substrates. FIG. 11 is to be understood as a counterpart to FIG. 8B and the SCR-part of FIG. 9, although for the sake of simplicity it is presented in a slightly different format. It will of course be appreciated that FIG. 11 does not "go with" FIG. 8A "as is", since, if for no other reason, they have different substrate dopings. We omit the n-type substrate counterpart to FIG. 8A, since it is readily understood that it could have essentially the same structure as FIG. 8A, except that the polarities of the dopants would be reversed. We do include FIG. 11, however, since the preferred layout of the SCR's is somewhat different for an n-type substrate than for the p-type substrate shown in FIG. 8B. In FIG. 11 the diagonal shading used to denote p-type doping, and the horizontal shading used to denote n-type doping, are local to FIG. 11. The heavy lines denoting oxide, the dotted shading for polysilicon, and the cross-hatching for metal are, however, the same as used in FIGS. 8A–B and in FIG. 9.

In particular, then, the n-type substrate 138 includes p-wells 139, 140 and 141. P-wells 139 and 140 have respective metal traces 142 and 143 deposited thereon; these are connected to $V_{DD}$ and $DV_{DD}$, respectively. It will be understood, of course, that there is a layer of glass which covers the top of the IC, and that the metalization is deposited on top thereof, making contact with elements such as p-wells 139 and 140 through holes in the layer of glass. For the sake of simplicity in the illustration, that layer of glass has been omitted, and the only metalization shown is that which would be in a hole in the omitted layer of glass.

P-well 141 contains within it interior n-wells 150 and 151, each of which are connected by metalization 153 to the pad 154 to be protected. The pnpn structure forming the SCR that protects the pad 154 relative to $V_{DD}$ is made up of regions 139, 138, 141 and 150, respectively. Likewise, the pnpn structure forming the SCR that protects the pad 154 relative to $DV_{DD}$ is made up of regions 140, 138,141 and 151, respectively.

Each SCR has a trigger FET. These are formed by the layers of oxide 144 and 145, polysilicon 146 and 147, and metal contacts 148 and 149 that serve as interconnections to the respective trigger circuits.

Figure 12B:
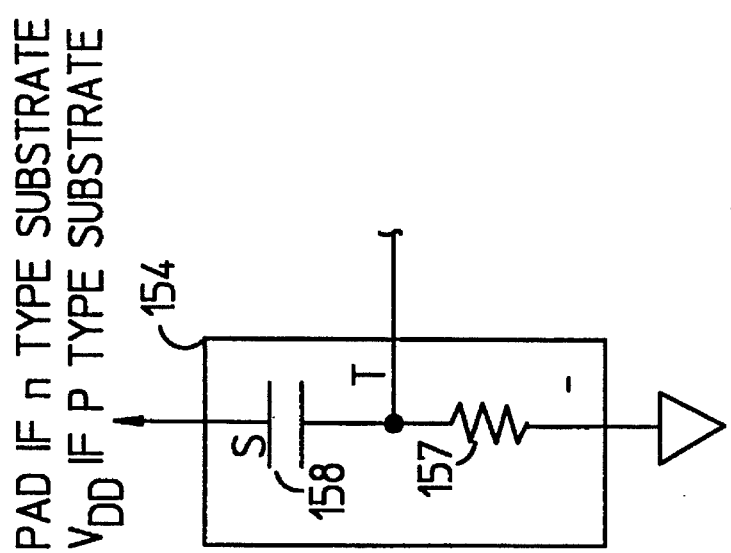
FIGS. 12A–C are schematic illustrations of alternate trigger circuits that could be used in connection with the SCR's in the protection cells of FIGS. 6, 7 and 10.
Figure 12C:
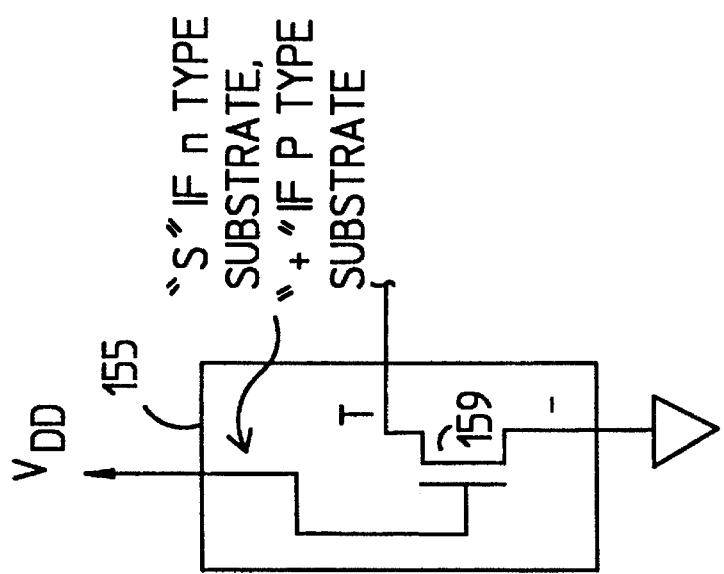
Figure 12A:
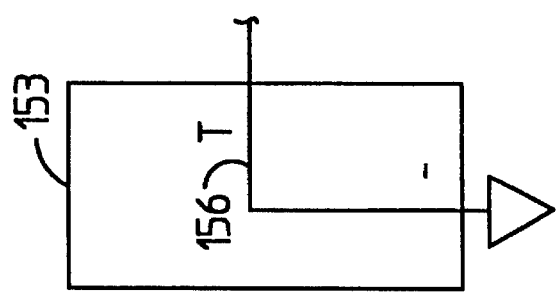

And finally, regardless of whether a p-type or n-type substrate is in use, FIGS. 12A–C show other possible (fixed threshold) trigger circuits 153, 154 and 155 that might be used in place of trigger circuits 45–49 and 123 and 124. The simplest of these is shown in FIG. 12A. There trigger circuit 153 consists simply of a conductor between nodes "T" and "–". In this case transistor 57 is simply relied upon to momentarily break down and thus trigger the associated SCR. In FIG. 12B a resistor 157 is connected between nodes "T" and "–" for trigger circuit 154. Operation of trigger circuit 154 is similar to trigger circuit 153 of FIG. 12A. However, an optional capacitor 158 may additionally be coupled between the "S" node and the "T" node. This enhances operation of the trigger circuit 154, but to be effective the capacitor unfortunately consumes a large amount of space on the IC. Lastly, FIG. 12C shows a trigger circuit 155 comprising a FET 159 whose drain is the "T" node and whose source is the "–" node. The gate of the FET 159 is the "S" node for n-type substrates and the "+" node for p-type substrates. This trigger circuit (155) allows the gate of transistor 57 to float during case #2 ESD events. This permits some coupling of the ESD voltage to the gate through the FET 57 itself, and allows FET 57 to break down at a somewhat lower voltage than required when the gate is grounded as in FIG. 12A.

I claim:

1. An ESD protected integrated circuit comprising:

a power distribution network;

first and second power return networks;

an output circuit coupled between the power distribution network and the first power return network and generating at an output pad a signal sent outside the integrated circuit;

a first ESD protection device coupled between the output pad and the first power return network; and a second ESD protection device coupled between the output pad and the second power return network.

2. An integrated circuit as in claim 1 wherein the first and second ESD protection devices are triggerable, and wherein the integrated circuit further comprises:

a first trigger circuit coupled between the output pad and the first power return network and also coupled to the first ESD protection device; and a second trigger circuit coupled between the output pad and the second power return network and also coupled to the second ESD protection device.

3. An integrated circuit as in claim 2 wherein the first and second ESD protection devices are SCR's.

4. An ESD protection circuit for an integrated circuit incorporating $V_{DD}$, GND, DGND and bonding pads, the integrated circuit comprising:

a semiconductor substrate doped with p-type material upon which the integrated circuit is fabricated;

a conductive trace that is electrically coupled to a bonding pad that is to be protected from ESD;

a conductive trace that distributes $V_{DD}$ throughout the integrated circuit;

a conductive trace that distributes GND throughout the integrated circuit;

a conductive trace that distributes DGND throughout the integrated circuit;

first and second SCR's each comprising adjoining intervening pnpn regions of p doped and n doped material, the adjoining and intervening pnpn regions having an n end, an interior n region and a p end, the interior n region being formed of an n-well in the substrate, which n-well is common to both the first and second SCR's, each of the first and second SCR's being electrically coupled at their p end to the conductive trace that is electrically coupled to the bonding pad, the first SCR being electrically coupled at its n end to the conductive trace distributing GND and the second SCR being electrically coupled at its n end to the conductive trace distributing DGND;

first and second trigger circuits comprising FET's that share the common n-well, each trigger circuit having a first node electrically connected to the conductive trace electrically coupled to the bonding pad to be protected from ESD and a second node electrically connected to the conductive trace that distributes $V_{DD}$;

the first trigger circuit having a third node electrically connected to the conductive trace that distributes GND and having a fourth node that is coupled to the gate of a first trigger FET whose drain is coupled to the interior n region of the first SCR and whose source is coupled to the conductive trace that distributes GND; and the second trigger circuit having a third node electrically connected to the conductive trace that distributes DGND and having a fourth node that is coupled to the gate of a second trigger FET whose drain is coupled to the interior n region of the second SCR and whose source is coupled to the conductive trace that distributes DGND.

5. An ESD protected integrated circuit operable between a power supply and a power supply return, the ESD protected integrated circuit comprising:

a triggerable protection device having a normally non-conductive state and a triggered conductive state, electrically coupled to first and second bonding pads that are to be protected against an electrical potential developing therebetween, and having a trigger node, the triggerable protection device entering the triggered conductive state in response to the application of a trigger signal to the trigger node;

a trigger circuit having first and second inputs respectively coupled electrically to the first and second bonding pads, having a trigger signal output electrically coupled to the trigger node of the triggerable protection device, and also having a threshold selection input, the trigger circuit triggering the triggerable protection device in response to the potential between the first and second bonding pads exceeding a first threshold when a first signal is applied to the threshold selection input, and in response to the potential between the first and second bonding pads exceeding a second threshold when a second signal is applied to the threshold selection input; and a third bonding pad, having ESD protection therefrom to the power supply and therefrom to the power supply return, and otherwise electrically coupled within the integrated circuit to only the threshold selection input.

6. The ESD protected integrated circuit of claim 5 wherein the first and second signals are no voltage and the voltage of the power supply when in operation, and further wherein the first and second thresholds are respectively the sum of the voltage value for the first signal plus a first constant and the sum of the voltage value for the second signal plus a second constant.

7. The ESD protected integrated circuit of claim 5, and further comprising an external environment into which the ESD protected integrated circuit is installed for operation, the external environment comprising an electrical connection between a pin of the ESD protected integrated circuit that is electrically coupled to the third bonding pad and a power-on signal indicative that the power supply is supplying power.

8. The ESD protected integrated circuit of claim 7 wherein the substrate is of n-type material, the first and second bonding pads represent the power supply and the power supply return, the external environment is a circuit board and the power-on signal is the voltage produced by the power supply.

9. An ESD protected integrated circuit operable between a power supply and a power supply return, the ESD protected integrated circuit comprising:

a triggerable protection device having a normally non-conductive state and a triggered conductive state, electrically coupled to first and second bonding pads that are to be protected against an electrical potential developing therebetween, and having a trigger node, the triggerable protection device entering the triggered conductive state in response to the application of a trigger signal to the trigger node;

a trigger circuit having first and second inputs respectively coupled electrically to the first and second bonding pads, having a trigger signal output electrically coupled to the trigger node of the triggerable protection device, and also having a threshold selection input, the trigger circuit triggering the triggerable protection device in response to the potential between the first and second bonding pads exceeding a first threshold when a first signal is applied to the threshold selection input, and in response to the potential between the first and second bonding pads exceeding a second threshold when a second signal is applied to the threshold selection input; and a third bonding pad electrically coupled within the integrated circuit to only the threshold selection input.

10. The ESD protected integrated circuit of claim 9 wherein the first and second signals are no voltage and the voltage of the power supply when in operation, and further wherein the first and second thresholds are respectively the sum of the voltage value for the first signal plus a first constant and the sum of the voltage value for the second signal plus a second constant.

11. The ESD protected integrated circuit of claim 9, and further comprising an external environment into which the ESD protected integrated circuit is installed for operation, the external environment comprising an electrical connection between a pin of the ESD protected integrated circuit that is electrically coupled to the third bonding pad and a power-on signal indicative that the power supply is supplying power.

12. The ESD protected integrated circuit of claim 11 wherein the substrate is of n-type material, the first and second bonding pads represent the power supply and the power supply return, the external environment is a circuit board and the power-on signal is the voltage produced by the power supply.

* * * * *